United States Patent
Shimizu et al.

(10) Patent No.: US 8,144,742 B2
(45) Date of Patent: Mar. 27, 2012

(54) SURFACE EMITTING LASER DEVICE

(75) Inventors: Hitoshi Shimizu, Tokyo (JP); Takeo Kageyama, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 451 days.

(21) Appl. No.: 12/500,757

(22) Filed: Jul. 10, 2009

(65) Prior Publication Data

US 2010/0008674 A1    Jan. 14, 2010

Related U.S. Application Data

(63) Continuation-in-part of application No. 12/040,348, filed on Feb. 29, 2008, now Pat. No. 7,577,176.

(30) Foreign Application Priority Data

Mar. 1, 2007    (JP) ................................. 2007-052006

(51) Int. Cl.
   *H01S 5/20*   (2006.01)
   *H01S 5/00*   (2006.01)
(52) U.S. Cl. ............ 372/45.011; 372/45.01; 372/46.013
(58) Field of Classification Search ............. 372/44.011, 372/45.01, 45.011, 46.013, 46.015
See application file for complete search history.

(56) References Cited

U.S. PATENT DOCUMENTS

| | | | |
|---|---|---|---|
| 2002/0136253 A1* | 9/2002 | Iwai et al. | |
| 2005/0123014 A1* | 6/2005 | Shimizu et al. | |

FOREIGN PATENT DOCUMENTS

| | | |
|---|---|---|
| JP | 3020167 B2 | 1/2000 |
| JP | 2007-258581 | 10/2004 |
| JP | 2005-252032 | 9/2005 |
| JP | 2007-311632 | 11/2007 |

OTHER PUBLICATIONS

U.S. Appl. No. 09/581,179, filed Sep. 12, 2000, Iwai, et al.*
A.W. Jackson, et al., "OC-48 capable InGaAsN verical cavity lasers", Electronics Letters, vol. 37 No. 6, pp. 355-356, Mar. 15, 2001.

* cited by examiner

*Primary Examiner* — Armando Rodriguez
(74) *Attorney, Agent, or Firm* — Oblon, Spivak, McClelland, Maier & Neustadt, L.L.P.

(57) ABSTRACT

To provide a surface emitting laser device including a substrate; an optical resonator arranged on the substrate, the optical resonator including a lower multilayer reflector and an upper multilayer reflector; a strained active layer arranged in the resonator, the strained active layer having a multiple quantum well structure formed with a quantum well layer and a barrier layer; and a current confinement layer arranged on an upper side of the strained active layer, the current confinement layer including a selectively oxidized portion, where the current confinement layer is arranged at a position where a strain in the selectively oxidized portion influences the strained active layer.

8 Claims, 7 Drawing Sheets

SURFACE EMITTING LASER DEVICE

CROSS-REFERENCE TO RELATED APPLICATIONS

This application is a Continuation-in-Part of and claims the benefit of priority under 35 U.S.C. §120 from U.S. application Ser. No. 12/040,348, filed Feb. 29, 2008, which claims priority Japanese priority document 2007-052006 filed in Japan on Mar. 1, 2007, the entire contents of both of which are hereby incorporated by reference.

BACKGROUND OF THE INVENTION

1. Field of the Invention

The present invention relates to a vertical cavity surface emitting laser device.

2. Description of the Related Art

It is considered that in future, a large number of surface emitting laser (VCSEL) devices that emit a laser light in a wavelength band of 1000 nm to 2500 nm with an operating speed equal to or higher than 10 Gbps will be required in the fields of optical interconnection and optical communication.

As a conventional surface emitting laser device, a vertical cavity surface emitting laser device in which a distributed Bragg reflector (DBR) laser is built by forming an active layer between an upper and a lower multilayer reflectors made of semiconductor and forming a current confinement layer that confines the current path to improve current injection efficiency has been disclosed (see Japanese Patent Application Laid-Open No. 2005-252032). The current confinement layer is formed by selectively oxidizing a layer made of AlAs, and includes a current confining portion in a circular shape made of AlAs disposed in the center and a selectively oxidized portion made of oxidized aluminum disposed around the current confining portion.

Meanwhile, a surface emitting laser device for a long wavelength band formed with an active layer in a multiple quantum well structure made of GaInNAs-based materials on a GaAs substrate is also attracting attention. For example, a GaInNAs-based active layer for the wavelength band of 1.3 μm to 1.55 μm is a so-called high strain system with an amount of compressive strain of the quantum well layer equal to or more than 2%. Therefore, in general, from a viewpoint of the critical film thickness of the quantum well layer, the thickness of a barrier layer is 20 nm to 25 nm, and the number of quantum wells is two to three. The active layer, for example, is formed by alternately growing a quantum well layer of $Ga_{0.63}In_{0.37}N_{0.01}As_{0.99}$ with a thickness of 7.3 nm, and a barrier layer made of GaAs with a thickness of 20 nm to 25 nm, and the number of the quantum well is three.

With a surface emitting laser device for a long wavelength band that adopts an active layer in a quantum dot structure made of InAs or InGaAs, a barrier layer has the same thickness as the above, because the quantum dot is highly strained.

Accordingly, the conventional surface emitting laser device with the highly strained active layer has a high threshold current and a low optical output, thereby operating in a low speed without increasing the relaxation frequency.

By making the barrier layer thin and by disposing each quantum well layer close to a position where the amplitude of an optical standing wave generated in an optical resonator is large, a modal gain can be increased because an optical confinement factor to the quantum well layer will be increased and the threshold current can be lowered (see A. W. Jackson, et al., "OC-48 capable InGaAsN vertical cavity lasers", Electronics Letters, vol. 37 No. 6, pp. 355-356 (2001)).

However, with the highly strained active layer, there is a problem that a dislocation such as a misfit dislocation tends to occur to the quantum well layer, when the thickness of the barrier layer is made thin, thereby degrading the reliability of the device. As a result, the thickness of the barrier layer had to be thick, and the modal gain could not be increased.

SUMMARY OF THE INVENTION

It is an object of the present invention to at least solve the above-described problems.

A surface emitting laser device according to the present invention includes a substrate; an optical resonator arranged on the substrate, the optical resonator including a lower multilayer reflector and an upper multilayer reflector; a strained active layer arranged in the resonator, the strained active layer having a multiple quantum well structure formed with a quantum well layer and a barrier layer; and a current confinement layer arranged on an upper side of the strained active layer, the current confinement layer including a selectively oxidized portion. The current confinement layer is arranged at a position where a strain in the selectively oxidized portion influences the strained active layer.

Furthermore, a surface emitting laser device according to the present invention includes a substrate; an optical resonator arranged on the substrate, the optical resonator including a lower multilayer reflector and an upper multilayer reflector; a strained active layer arranged in the resonator, the strained active layer having a quantum dot structure formed with a quantum dot layer in which a quantum dot portion is formed and a barrier layer; and a current confinement layer arranged on the strained active layer, the current confinement layer including a selectively oxidized portion. The current confinement layer is arranged at a position where a strain in the selectively oxidized portion influences the strained active layer.

The above and the other objects, features, advantages, and technical and industrial significance of the present invention will be better understood by reading the following detailed description of the present invention, when considered in connection with the accompanying drawings.

DETAILED DESCRIPTION OF THE PREFERRED EMBODIMENTS

Exemplary embodiments of a surface emitting laser device according to the present invention will be explained in detail below with reference to FIGS. 1 to 8. The present invention is not limited to the embodiments, and various modifications may be made without departing from the scope of the invention.

First Embodiment

A surface emitting laser device according to a first embodiment of the present invention will now be explained. The surface emitting laser device according to the first embodiment is a surface emitting laser device in which a strained active layer having a multiple quantum well structure made of GaInNAs is grown on a substrate made of GaAs with an oscillation wavelength of 1300 nm.

Figure 1:
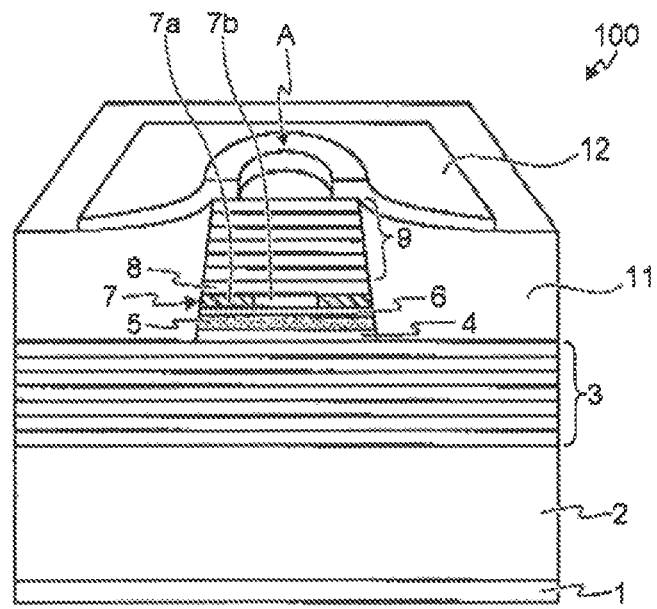
FIG. 1 is a schematic sectional perspective view of a surface emitting laser device according to a first embodiment of the present invention.
Figure 2:
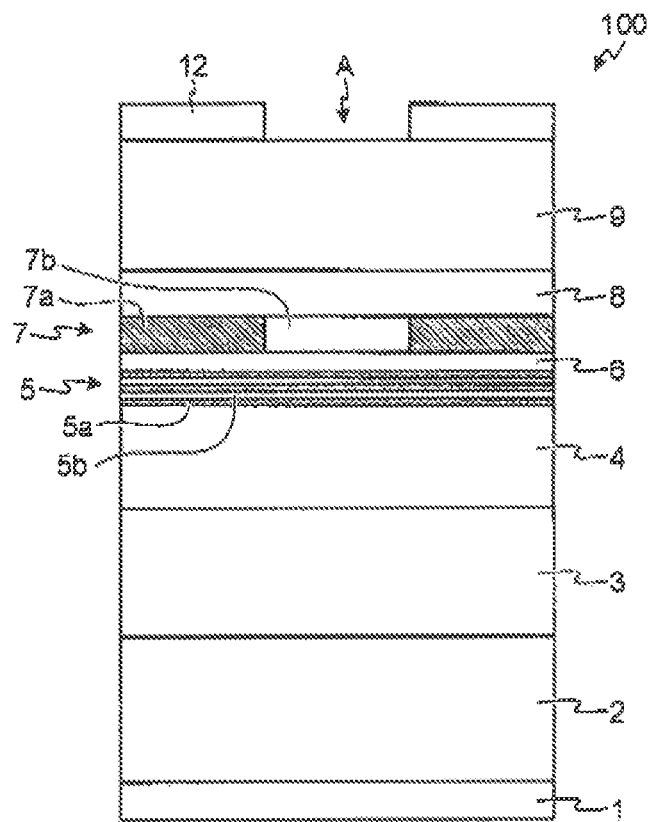
FIG. 2 is a schematic sectional view of a growth structure of the surface emitting laser device shown in FIG. 1.

FIG. 1 is a schematic sectional perspective view of the surface emitting laser device according to the first embodiment. FIG. 2 is a schematic sectional view of a growth structure of the surface emitting laser device shown in FIG. 1. As shown in FIGS. 1 and 2, in the surface emitting laser device 100 according to the first embodiment, an n-GaAs substrate 2 with a plane orientation (100), an n-DBR mirror 3 that is a lower multilayer reflector, an n-GaAs cladding layer 4, a strained active layer 5, a p-GaAs cladding layer 6, a current confinement layer 7, a p-GaAs cladding layer 8, and a p-DBR mirror 9 that is an upper multilayer reflector are sequentially formed. The n-GaAs cladding layer 4 to the p-DBR mirror 9 are in a mesa post structure and the mesa post, for example, is embedded with a polyimide 11. A p-side electrode 12 that includes an opening A is formed on the top surface of the p-DBR mirror 9 and the polyimide 11, and an n-side electrode 1 is formed under the surface of the n-GaAs substrate 2.

On the surface of the n-GaAs substrate 2, an n-GaAs buffer layer of which the carrier concentration is $1 \times 10^{18}$ cm$^{-3}$ is grown at a thickness of 0.1 μm to smooth the surface. When the oscillation wavelength of the surface emitting laser 100 is λ and the refractive index of each constituent material is n, the n-DBR mirror 3 is formed with 35.5 pairs of a multilayer film made of a pair of an n-type $Al_{0.9}Ga_{0.1}As$ layer and an n-type GaAs layer with thicknesses of λ/4n. The p-DBR mirror 9 is formed with 23 pairs of a multilayer film made of a pair of a p-type Al0.9Ga0.1As layer and a p-type GaAs layer with thicknesses of λ/4n. When an average refractive index of each layer is N, the n-GaAs cladding layer 4 to the p-GaAs cladding layer 8 are formed so that the total thickness is λ/N. Accordingly, an optical resonator that has a resonator length of λ/N is formed between the n-DBR mirror 3 and the p-DBR mirror 9.

The strained active layer 5 is formed by alternately growing three quantum well layers 5a made of $Ga_{0.63}In_{0.37}N_{0.01}As_{0.99}$ with the thickness of 7.3 nm, and two barrier layers 5b made of GaAs with the thickness of 8 nm. The strained active layer 5 is disposed at the position where the quantum well layer 5a in the center is apart from the top surface of the n-DBR mirror 3 for λ/2N. In other words, in the first embodiment, the strained active layer 5 is grown at the position where the amplitude of the optical standing wave within the optical resonator is large, that is, at the center of the optical resonator that corresponds to a position of an antinode of the optical standing wave.

The current confinement layer 7 includes a selectively oxidized portion 7a of which the thickness is 15 nm and made of oxidized aluminum formed by selective oxidation, and a current confining portion 7b in a circular disk made of $p-Al_{0.98}GaAs$ as a non-selectively oxidized portion and placed approximately in the center within the selectively oxidized portion 7a. The center of the current confinement layer 7 is disposed at a position where the distance is 94 nm apart from the center of the strained active layer 5. The selectively oxidized portion 7a reduces volume during the selective oxidation and has a tensile strain.

When an active layer is made of the same composite material as the strained active layer 5, the number of the quantum well is three, and the thickness of the respective barrier layers are 8 nm, the theoretical critical film thickness of the quantum well layer is approximately 5.9 nm. However, in the surface emitting laser device 100 according to the first embodiment, the current confinement layer 7 is disposed at the position where the influence of the strain within the selectively oxidized portion 7a reaches the strained active layer 5. Accordingly, the strain within the strained active layer 5 is fully compensated by the strain within the selectively oxidized portion 7a, thereby suppressing the generation of dislocation, even if the thickness of the respective quantum well layers 5a is 7.3 nm that is above the critical film thickness.

Figure 3:
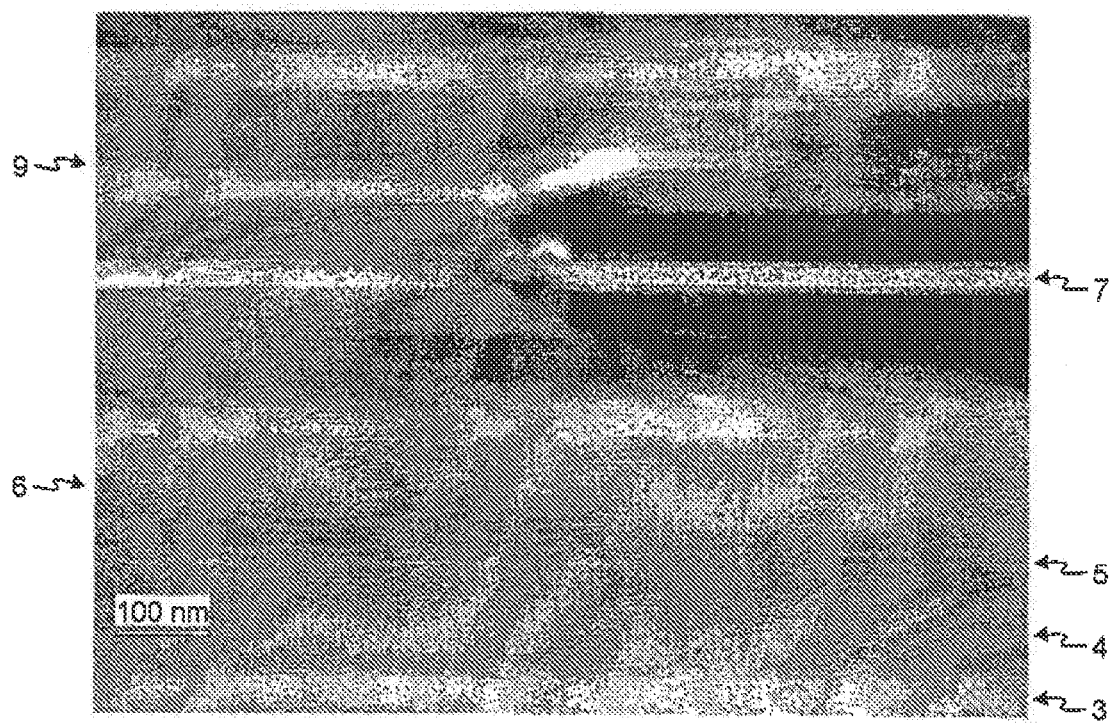
FIG. 3 is a TEM image of a cross section of a surface emitting laser device that includes the same configuration as the surface emitting laser device shown in FIG. 1.

FIG. 3 is a TEM image of a cross section of a surface emitting laser device that has the same configuration as the surface emitting laser device shown in FIG. 1. In FIG. 3, the horizontal stripes that seem to be in parallel show the n-DBR mirror 3, the n-GaAs cladding layer 4, the strained active layer 5, the p-GaAs cladding layer 6, the current confinement layer 7, and the p-DBR mirror 9. The current confinement layer 7 is formed within the p-DBR mirror 9. In the current confinement layer 7, a portion with uniform brightness placed at the left side from the center of the photograph is the current confining portion, and a portion with uneven brightness placed at the right side is the selectively oxidized portion. The dark and light shadings in waveform that can be seen around the selectively oxidized portion reflect the strain that occurred thereat due to the strain stress in the selectively oxidized portion.

As shown in FIG. 3, the strain is generated within the distance approximately 300 nm from the current confinement layer 7. In other words, when the current confinement layer 7 is disposed at a position equal to or less than 300 nm from the strained active layer 5, the advantage of fully compensating the strain within the strained active layer 5 by the strain within the selectively oxidized portion 7a can sufficiently be obtained. It should be noted that the distance is preferably equal to or more than 50 nm.

An operation of the surface emitting laser device 100 will now be explained. In the surface emitting laser device 100, when a voltage is applied between the n-side electrode 1 and the p-side electrode 12, and current is injected, the current confinement layer 7 increases current density by restricting the current path. Each of the quantum well layers 5a of the strained active layer 5 injected with the current with high current density emits light in a 1300-nm band. Then, the optical resonator formed by the n-DBR mirror 3 and the p-DBR mirror 9 causes laser oscillation to the emitted light at the wavelength of 1300 nm, and emits laser light of the wavelength of 1300 nm from the opening A.

Figure 4:
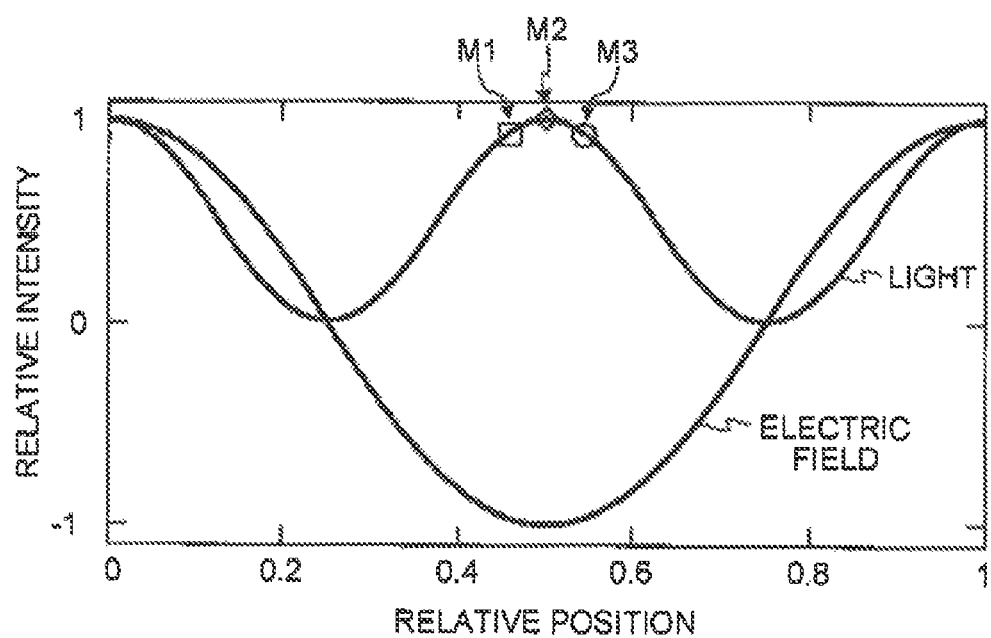
FIG. 4 is a schematic diagram of intensity distributions of light generated within an optical resonator of the surface emitting laser device shown in FIG. 1 and electric field of the light.

FIG. 4 is a schematic diagram of an intensity distribution of light and an electric field of light generated within the optical resonator of the surface emitting laser device 100. The horizontal axis shows a relative position within the optical resonator when λ/N is 1, 0 shows the position of the upper surface of the n-DBR mirror 3, and 1 shows the position of the lower surface of the p-DBR mirror 9. The vertical axis shows a relative intensity of light or electric field when the maximum amplitude is 1. The symbols M1 to M3 respectively show the position of each of the quantum well layers 5a of the strained active layer 5 in the optical resonator. The interval between the symbols M1 to M3 is 8 nm. As shown in FIG. 3, each of the quantum well layers 5a is placed close to the position of the antinode of the optical standing wave, thereby increasing the optical confinement factor.

With a simulation calculation, in the surface emitting laser device 100, the optical confinement factor becomes 2.3%, and a threshold current density decreases to 2 kA/cm$^2$ when the reflectivity of an optical emission surface that is the upper surface of the p-DBR mirror 9 is 99.8%. When the interval between each of the quantum well layers 5a is 20 nm, the optical confinement factor is 2%, and the threshold current density is 3 kA/cm$^2$ when the reflectivity of the optical emission surface is 99.8%.

As described above, the current confinement layer 7 is disposed at the position where the distance is 94 nm apart from the strained active layer 5. Because λ is 1300 nm and N is 3.45, λ/4N is 94 nm. In other words, the current confinement layer 7 is placed at the position where the distance from the strained active layer 5 is λ/4N, that is, at the relative position of 0.75 in FIG. 4. In other words, the current confinement layer 7 is placed at the node position where the amplitude of the optical standing wave is small. As a result, the light that forms the standing wave will not be absorbed or scattered by the selectively oxidized portion 7a of the current confinement layer 7, thereby decreasing the threshold current density of the surface emitting laser device 100 without fail. The same advantage can be obtained even when the distance to the strained active layer 5 of the current confinement layer 7 is 3λ/4N. In this case, because the distance is sufficiently close to the strained active layer 5, the advantage of suppressing leak current by blocking the current can also be maintained. The current confinement layer 7 may be placed at the position deviated from the node position, to an extent so as the light that virtually forms the standing wave will not be absorbed or scattered by the selectively oxidized portion 7a of the current confinement layer 7.

To sufficiently enlarge the optical confinement factor, the thickness of the barrier layer 5b is preferably equal to or less than 10 nm. To prevent the generation of dislocation in the quantum well layer 5a, the thickness of the barrier layer 5b is preferably equal to or more than 5 nm.

A manufacturing method of the surface emitting laser device 100 according to the first embodiment will now be explained. The n-DBR mirror 3, the n-GaAs cladding layer 4, the strained active layer 5, the p-GaAs cladding layer 6, the current confinement layer 7, the p-GaAs cladding layer 8, and the p-DBR mirror 9 are sequentially grown epitaxially by using, for example, any one of a molecular beam epitaxy (MBE) method, a gas source MBE method, a chemical molecular beam epitaxy (CBE) method, and a metal-organic chemical vapor deposition (MOCVD).

Then, by using a plasma CVD method, a silicon nitride film is formed on a growing surface of the p-DBR mirror 9, and a circular pattern of a diameter of approximately 30 μm is transferred thereon by a photolithography technique using a photoresist. With the transferred circular resist mask, the silicon nitride film is etched by a reactive ion etching (RIE) method using CF$_4$ gas. A mesa post in a columnar structure with the diameter of approximately 30 μm is formed, by etching until reaching the n-DBR mirror 3, by a reactive ion beam etching (RIBE) method using chlorine gas. The etching by the RIBE method is stopped at the depth within the n-DBR mirror 3.

Next, at this state, by heating to 400° C. in a water vapor atmosphere and left to stand, the current confinement layer 7 is selectively oxidized. In this manner, the selectively oxidized portion 7a is formed. The current confining portion 7b that the selectively oxidized portion 7a is not formed as a non-selectively oxidized portion has a diameter from 3 μm to 10 μm, and, for example, may be 6 μm. When the silicon nitride film is completely removed using the RIE method, the surrounding of the mesa post is embedded with the polyimide 11.

A new silicon nitride film is then formed on the entire surface by the plasma CVD method. The silicon nitride film is removed in a predetermined shape, and forms the p-side electrode 12 made of Ti/Pt/Au. After polishing the n-GaAs substrate 2 to approximately 200 μm, deposit the n-side electrode 1 made of AuGeNi/Au on the surface, and anneal at approximately 400° C. in a nitrogen atmosphere in the end.

When the characteristics of the surface emitting laser device 100 manufactured by the method is measured, at a temperature of 25° C., the threshold current was 1 mA, the slope efficiency was 0.25 W/A, the 3-dB bandwidth at a small signal modulation was 10 GHz, and the maximum CW oscillation temperature was equal to or more than 100° C. In other words, the surface emitting laser device 100 has a low threshold current, can be operated with high speed, and can be operated in high temperature. Moreover, the surface emitting laser device 100 can be driven for a million hours at an environmental temperature of 25° C. and has a long life with high reliability.

For a comparison, the characteristics of a surface emitting laser device that has the same configuration as the surface emitting laser device according to the first embodiment, but the thickness of each barrier layer is 20 nm, and the distance of the current confinement layer from the strained active layer is 630 nm, in other words, 7λ/4N, is also measured. At a temperature of 25° C., the threshold current was 1.5 mA, the slope efficiency was 0.25 W/A, the 3-dB bandwidth at a small signal modulation was 7 GHz, and the maximum CW oscillation temperature was 80° C.

As explained in the above, in the surface emitting laser device 100 according to the first embodiment, the current confinement layer 7 is disposed at the position where the influence of the strain within the selectively oxidized portion 7a reaches the strained active layer 5, thereby enabling the low threshold current with high reliability.

Second Embodiment

A surface emitting laser device according to a second embodiment of the present invention will now be explained. The surface emitting laser device according to the second embodiment has the same configuration as the surface emitting laser device according to the first embodiment, except that the strained active layer is in a quantum-dot structure made of InAs.

Figure 5:
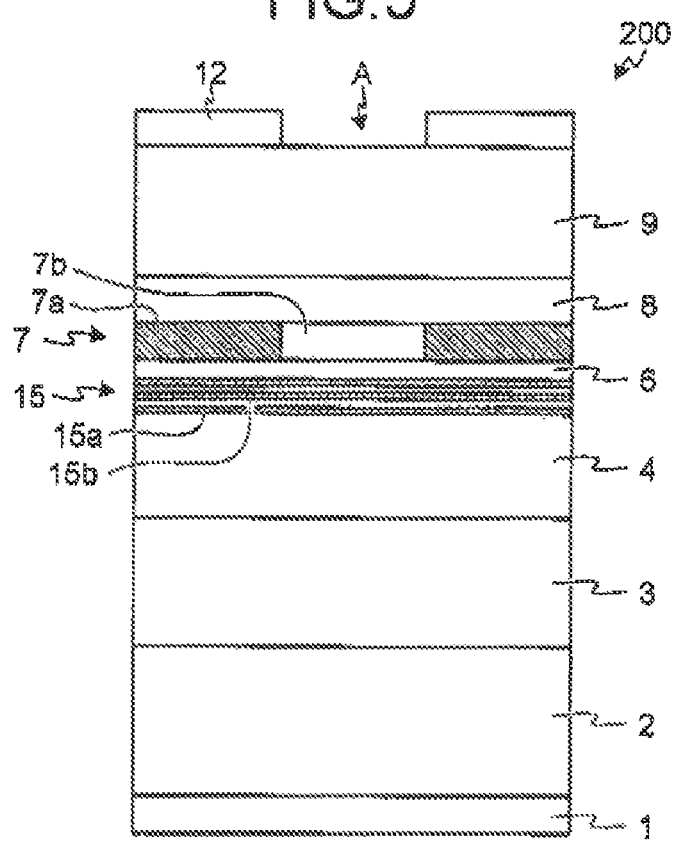
FIG. 5 is a schematic sectional view of a growth structure of a surface emitting laser device according to a second embodiment of the present invention.
Figure 6:
FIG. 6 is a schematic sectional view of a quantum dot layer of the surface emitting laser device shown in FIG. 5.

FIG. 5 is a schematic sectional view of a growth structure of the surface emitting laser device according to the second embodiment. As shown in FIG. 5, in the surface emitting laser device 200 according to the second embodiment, a strained active layer 15 is formed by alternately growing three quantum dot layers 15a and two barrier layers 15b. FIG. 6 is a schematic sectional view of the quantum dot layer 15a of the surface emitting laser device 200. As shown in FIG. 6, the quantum dot layer 15a includes a quantum dot portion 15aa with the diameter approximately 15 nm in a barrier region 15ab at a density of approximately $3 \times 10^{10}$ cm$^{-2}$. The barrier layers 15b are made of GaAs with the respective thickness of 8 nm. The quantum dot layers 15a have the respective thickness of approximately 7 nm, the quantum dot portion 15aa is made of InAs, and the barrier region 15ab is made of GaAs.

The strain amount of the quantum dot portion 15aa is 7% that is highly strained. Similar to the surface emitting laser device 100 according to the first embodiment, the current confinement layer 7 is disposed at the position where the distance is 94 nm apart from the strained active layer 15, so that the influence of the strain within the selectively oxidized portion 7a reaches thereto. Accordingly, the strain within the active layer 15 is fully compensated by the strain within the selectively oxidized portion 7a, thereby suppressing the generation of dislocation even if the thickness of the respective quantum dot layers 15a is equal to or more than the critical film thickness of 5 nm.

The surface emitting laser device 200 can be manufactured by the same method as the surface emitting laser device 100 according to the first embodiment. To manufacture the active layer 15 here, after epitaxially growing the n-GaAs cladding layer 4, the material of InAs is supplied at an amount of approximately 2.5 monolayers, thereby growing the InAs in a three-dimensional direction. Then, form the quantum dot portion 15aa, and epitaxially grow the barrier region 15ab made of GaAs.

As described above, in the surface emitting laser device 200 according to the second embodiment, the current confinement layer 7 is disposed at the position where the strain within the selectively oxidized portion 7a reaches the strained active layer 15, thereby enabling the low threshold current with high reliability.

Third Embodiment

A surface emitting laser device according to a third embodiment of the present invention will now be explained. The surface emitting laser device according to the third embodiment has the same configuration as the surface emitting laser device according to the first embodiment, and has the same advantage, except that a tunnel junction layer is formed between the upper multilayer reflector and the active layer.

Figure 7:
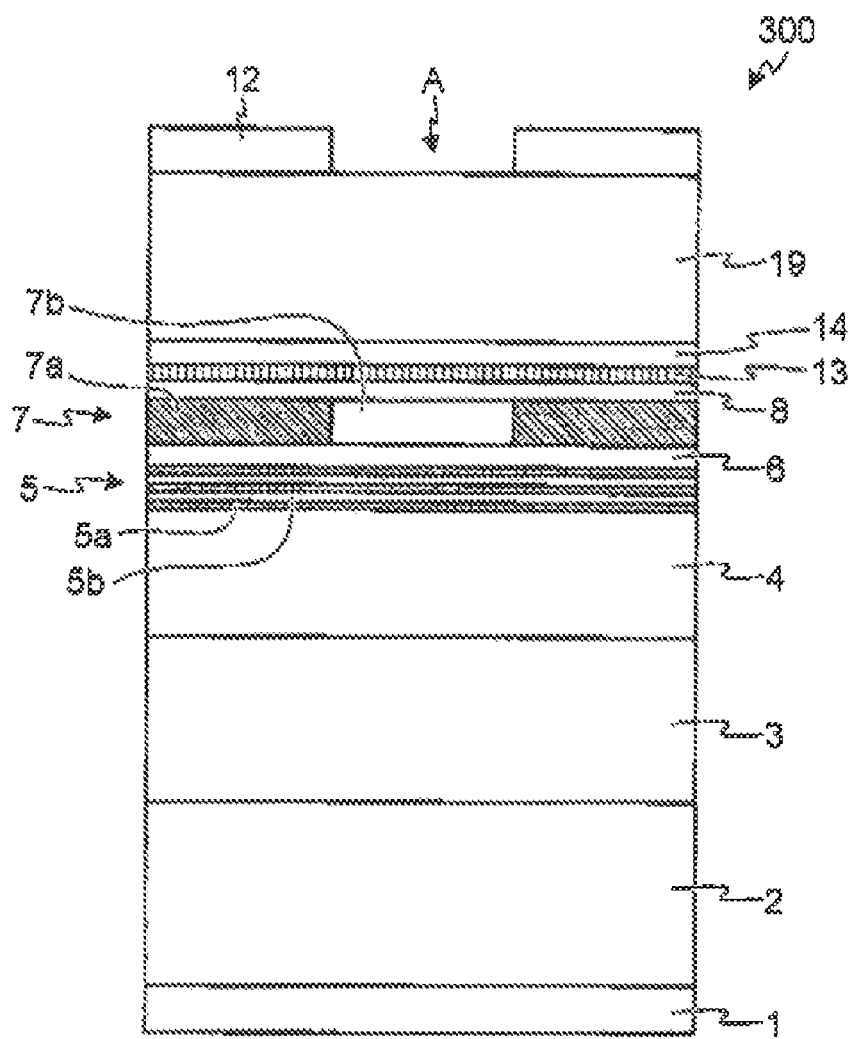
FIG. 7 is a schematic sectional view of a growth structure of a surface emitting laser device according to a third embodiment of the present invention.

FIG. 7 is a schematic sectional view of a growth structure of the surface emitting laser device according to the third embodiment. As shown in FIG. 7, the surface emitting laser device 300 according to the third embodiment differs from the surface emitting laser device 100 by including an n-DBR mirror 19 as the upper multilayer reflector and a tunnel junction layer 13 formed between the n-DBR mirror 19 and the strained active layer 5. An n-GaAs cladding layer 14 is also formed on the tunnel junction layer 13. In other words, the semiconductor layers grown above the tunnel junction layer 13 are n-type.

The tunnel junction layer 13 is sequentially formed with a p$^+$-GaAs layer that the carrier concentration is $1.5 \times 10^{20}$ cm$^{-3}$ with the thickness of 5 nm, an n$^+$-In$_{0.13}$Ga$_{0.87}$As layer that the carrier concentration is $5 \times 10^{19}$ cm$^{-3}$ with the thickness of 5 nm, and an n$^+$-GaAs layer that the carrier concentration is $5 \times 10^{19}$ cm$^{-3}$ with the thickness of 20 nm. The n-DBR mirror 19 is formed with 23 pairs of multilayer films made of a pair of the n-type Al$_{0.9}$Ga$_{0.1}$As layer and an n-type GaAs layer with the respective thickness of $\lambda/4n$.

With intervalence band absorption, the p-type semiconductor absorbs light of which the wavelength is equal to or more than 1000 nm. In the surface emitting laser device 300 according to the third embodiment, because the tunnel junction layer 13 is included, the upper multilayer reflector can be formed by a DBR mirror made of the n-type semiconductor. Compared with using the DBR mirror formed by the p-type semiconductor, the loss caused by absorption of light can be suppressed, thereby enabling to further decrease the threshold current. The tunnel junction layer 13 can be disposed in the upper multilayer reflector, instead of between the n-DBR mirror 19 and the strained active layer 5. The configuration and the composition of the tunnel junction layer 13 are appropriately adjusted depending on the position that is formed.

Such a tunnel junction layer, for example, is disclosed in non-patent literature by Naofumi Suzuki, et al., "1.1-μm band InGaAs VCSEL for optical interconnection", Shingakugiho, Vol. 105, No. 455, LQE2005-113 (2005-12), pp. 5-8.

Fourth Embodiment

A surface emitting laser device according to a fourth embodiment of the present invention will now be explained. The surface emitting laser device according to the fourth embodiment is different from the surface emitting laser devices according to the first to the third embodiments, at a point that the upper multilayer reflector is made of a dielectric multilayer film and at a point that the n-side electrode is disposed on the lower multilayer reflector.

Figure 8:
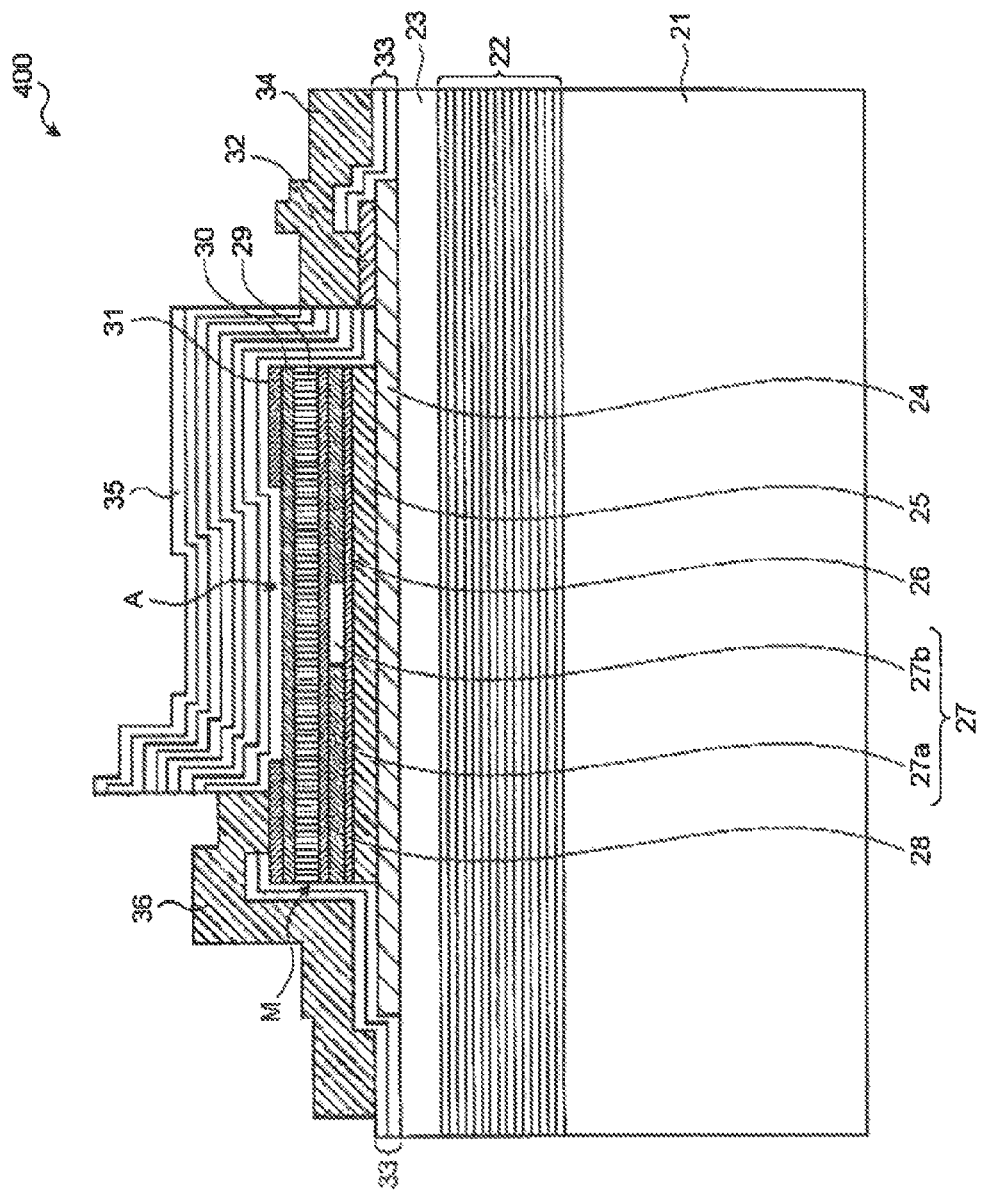
FIG. 8 is a schematic sectional view of a surface emitting laser device according to a fourth embodiment of the present invention.

FIG. 8 is a schematic sectional view of the surface emitting laser device 400 according to the fourth embodiment. As shown in FIG. 8, in the surface emitting laser device 400, a substrate 21, a lower DBR mirror 22 formed on the substrate 21, a buffer layer 23, an n-contact layer 24, a strained active layer 25, a lower graded composition layer 26, a current confinement layer 27 that includes a selectively oxidized portion 27a and a current confining portion 27b, an upper graded composition layer 28, a p-cladding layer 29, and a p$^+$-contact layer 30 are sequentially formed. The strained active layer 25 to the p$^+$-contact layer 30 forms a mesa post M in a cylinder.

The substrate 21 and the buffer layer 23 are made of undoped GaAs. The lower DBR mirror 22 is made of 34 pairs of GaAs/Al$_{0.9}$Ga$_{0.1}$As layer. The n-contact layer 24 is made of n-type GaAs. The strained active layer 25 and the current confinement layer 27 are respectively the same as the strained active layer 5 and the current confinement layer 7 of the surface emitting laser device 100 of the first embodiment. The lower graded composition layer 26 and the upper graded composition layer 28 are made of AlGaAs, and formed so that the Al composition increases in stages towards the current confinement layer 27 in the thickness direction. The p-cladding layer 29 and the p$^+$-contact layer 30 are respectively made of GaAs of p-type and p$^+$-type. A p-side electrode 31 in a circular ring that has an opening A in the center and coincides with the circumference of the mesa post M is formed on the mesa post M.

An upper DBR mirror 35 made of dielectric material is formed from the top of the p-side electrode 31 along the circumference of the mesa post M. The upper DBR mirror 35, for example, is made of 5 to 6 pairs of α-Si/SiO$_2$. However, the upper DBR mirror 35 may be made by a pair of SiN$_x$/SiO$_2$ or α-Si/Al$_2$O$_3$ so that an appropriate reflectivity of about 99% can be obtained depending on the refractive index of the material. The n-contact layer 24 is extended from below the mesa post M towards the outside in a radial direction, and an n-side electrode 32 in a semi-circular ring is formed on the surface. At a region where the upper DBR mirror 35 is not formed, a passivation film 33 that is made of dielectric material such as $SiN_x$ is formed to protect the surface.

An n-side wiring electrode 34 made of Au is formed so as to brought into contact with the n-side electrode 32, via an opening formed on the passivation film 33. A p-side wiring electrode 36 made of Au is also formed so as to brought into contact with the p-side electrode 31, via the opening formed on the passivation film 33. The n-side electrode 32 and the p-side electrode 31 are electrically connected to a not-shown current supply circuit provided outside, by the n-side wiring electrode 34 and the p-side wiring electrode 36, respectively.

In the surface emitting laser device 400, the center of the current confinement layer 27 is disposed at the position where the distance is 94 nm apart from the center of the strained active layer 25. In other words, the current confinement layer 27 is disposed at the position where the influence of the strain within the selectively oxidized portion 27a reaches the strained active layer 25. Therefore, the generation of dislocation can be suppressed, even if the respective thickness of the quantum well layers in the strained active layer 25 is equal to or more than the critical film thickness.

In the first to the third embodiments, the upper and the lower DBR mirrors are made of a semiconductor. It is preferable if at least one of the upper and the lower DBR mirrors is made of a dielectric multilayer film, because the one with high reflectivity can easily be made. The material for the dielectric multilayer film may be, for example, $SiO_2$, $TiO_2$, SiN, MgF, $Al_2O_3$, TiN, and $AlNSiO_2$.

In the first to the fourth embodiments, the current confinement layer is formed with AlAs and the selective oxidation is carried out thereto. However, any one of $Al_xGa_{1-x}As$ (x=0.95 to 0.998), AlInAs, and AlGaInAs may be grown and the selective oxidation may be carried out thereto. The current confinement layer may be formed by a superlattice made of an AlAs layer and a GaAs layer, and assuming that the thickness ratio of the AlAs layer and the GaAs layer is from 95:5 to 998:2, the selective oxidation may be carried out thereto.

In the first to the fourth embodiments, the laser oscillation wavelength is 1300 nm. However, if the surface emitting laser device includes the strained active layer according to the present invention, the laser oscillation wavelength may be from 1000 nm to 2500 nm. To make the laser oscillation wavelength from 1000 nm to 2500 nm, the laser oscillation wavelength is adjusted by a known method that adjusts a reflection wavelength of the DBR mirror, a resonator length, and a gain wavelength based on the laser oscillation wavelength, by using a GaAs substrate, an InP substrate, or a GaSb substrate.

In the first to the fourth embodiments, the active layer is disposed at the center of the optical resonator. However, the active layer may be disposed at a position of $m\lambda/2N$ (m: integer number) in the optical resonator. The current confinement layer may also be disposed at a position where the influence of the strain within the selectively oxidized portion reaches the strained active layer. Accordingly, the current confinement layer may be disposed directly above the strained active layer that includes a quantum well layer and a barrier layer, or may be disposed at a state that a layer of some sort is interposed therebetween.

In the first to the fourth embodiments, the layer number of the quantum well or the quantum dot layer of the active layer is 3, but the number may be two to eight. In other words, if the number of the quantum well layer or the quantum dot layer is two to eight, all the quantum well layers or the quantum dot layers can be disposed close to the antinode of the optical standing wave, thereby enabling to increase the modal gain.

In the first to the third embodiments, the n-type GaAs substrate is used for the substrate. However, a Semi-insulated substrate may be used.

In the first, the third, and the fourth embodiments, the substrate is made of GaAs and the quantum well layer is made of GaInNAs. However, the quantum well layer may be made of any one of GaInNAsSb, GaAsSb, and InGaAs, that are highly strained. Or, the substrate may be made of InP, and the quantum well layer may be made of any one of GaInAsP, AlGaInAs, and GaInNAsSb, that are highly strained.

In the second embodiment, the substrate is made of GaAs and the quantum dot portion is made of InAs. However, the substrate may be made of InP, and the quantum dot portion may be made of InGaAs.

In the first to the third embodiments, the lower multilayer reflector and the lower cladding layer are formed by the n-type semiconductor, the upper multilayer reflector and the upper cladding layer are formed by the p-type semiconductor, and the current confinement layer is formed above the active layer. However, the lower multilayer reflector and the lower cladding layer may be formed by the p-type semiconductor. Moreover, an embodiment may be made so that the influence of the strain of the current confinement layer may reach the active layer, by forming the current confinement layer under the active layer.

As described above, the surface emitting laser device according to the present invention is applicable and suitable in the fields of optical interconnection and optical communication.

Figure 9:
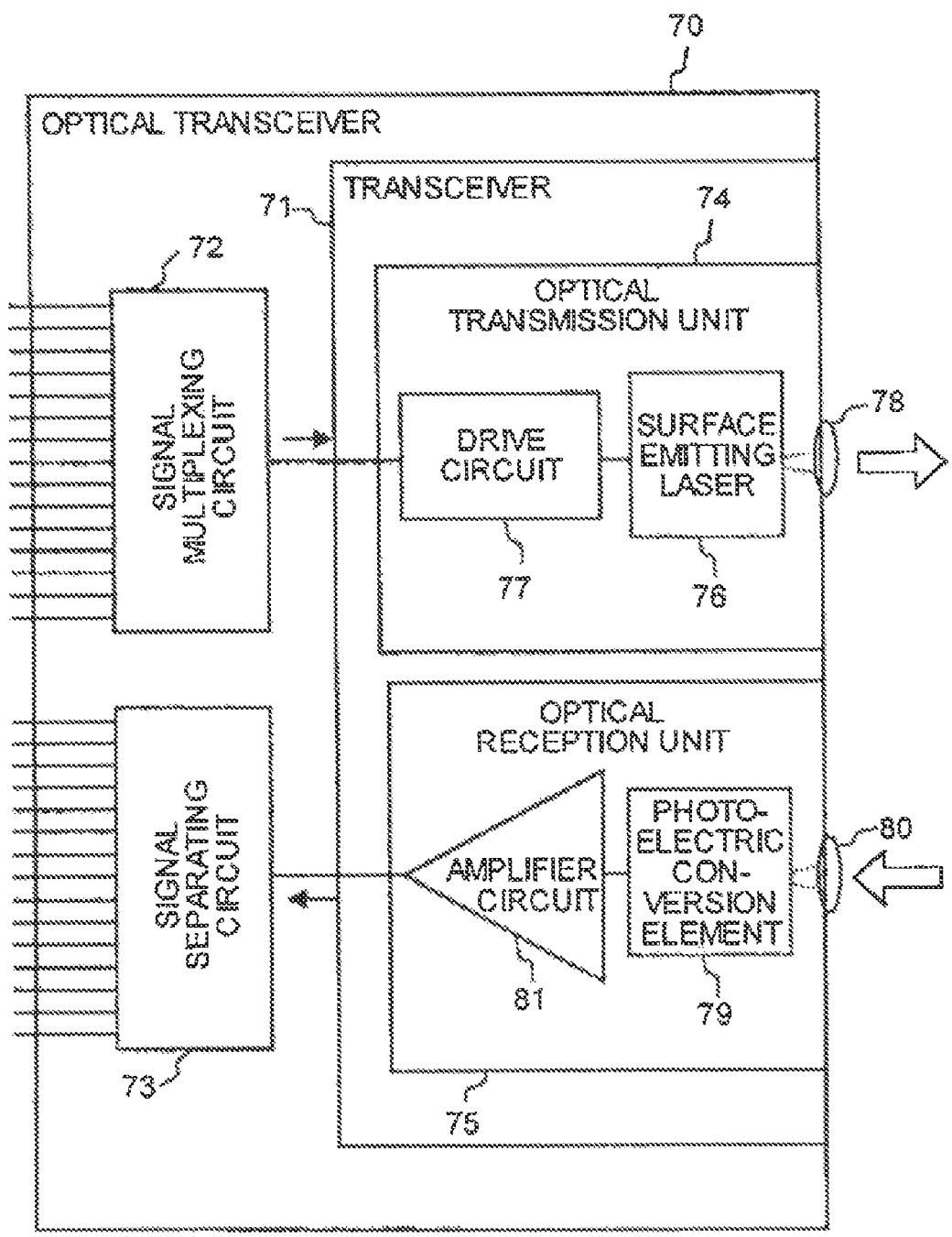
FIG. 9 is a block diagram of an optical transceiver according to a fifth embodiment of the present invention.

Next, an optical transceiver according to a fifth embodiment of the invention will be explained. In the fifth embodiment, the optical transceiver 70, which functions as an optical transmitter/receiver, uses the surface emitting laser device 100 in an optical transmission unit. FIG. 9 is a block diagram of a schematic structure of the optical transceiver according to the fifth embodiment. In FIG. 9, an optical transceiver 70 according to the fifth embodiment includes a transceiver 71 that has an optical transmitting unit 74 and an optical receiving unit 75 for respectively transmitting and receiving an optical signal, a signal multiplexing circuit 72 that multiplexes electric signals input to the optical transceiver 70 from outside, or external signal source(s) not shown, and inputs a multiplexed electric signal to the transceiver 71, and a signal separating circuit 73 that separates or demultiplexes an electric signal generated from an optical signal received by the transceiver 71.

The optical transmitting unit 74 is configured to convert a first electric signal which is an electric signal inputted from the signal multiplexing circuit 72 into an optical signal and transmitting the optical signal. More specifically, the optical transmitting unit 74 includes a surface emitting laser 76 that emits an optical signal, a drive circuit 77 that controls the surface emitting laser 76 based on the first electric signal inputted, and an output optical system 78 for outputting the optical signal emitted from the surface emitting laser 76 to outside, or external optical device(s) not shown. The drive circuit 72 functions as a control circuit and controls a current injected into the surface emitting laser 76 based on a first electric signal inputted.

As the surface emitting laser 76 included in the optical transmitting unit 74, the surface emitting laser device 100 according to the first embodiment is used. Therefore, the surface emitting laser 76 has a low threshold current and high reliability.

The optical receiving unit 75 is configured to convert an optical signal received from outside, or external optical signal source(s) not shown, into a second electric signal and outputs the second electric signal to the signal separating circuit 73. More specifically, the optical receiving unit 75 includes an input optical system 80 which guides the optical signal received to a photoelectric conversion element 79, the photoelectric conversion element 79 which converts the optical signal into the second electric signal, and an amplifier circuit 81 that amplifies the second electric signal outputted from the photoelectric conversion element 79. The photoelectric conversion element 79 is configured to output the second electric signal based on intensity of the optical signal received. As the photoelectric conversion element 79, elements such as a photoresistor or a photodiode can be used.

The signal multiplexing circuit 72 is configured to multiplex plural electric signals inputted from outside, or external electric signal source(s) not shown into a single electric signal as the first electric signal. The signal multiplexing circuit 72 outputs the first electric signal, which is the single electric signal obtained or generated by multiplexing the electric signals, to the optical transmitting unit 74 constituting the transceiver 71.

The signal separating circuit 73 is configured to separate or demultiplex the second electric signal, obtained from the optical receiving unit 75 which constitutes the transceiver 71, into the plural electric signals. Since the optical signal received by the optical receiving unit 75 inherently includes plural signals, the second electric signal obtained by photoelectrically converting the optical signal also includes plural electric signals. The signal separating circuit 73 separates the second electric signal, which is obtained or generated by photoelectric conversion of the optical signal, into plural electric signals to extract information.

Namely, in the fifth embodiment, the transceiver 71 includes, at least, the optical transmitting unit 74 that includes the surface emitting laser device 76, the control circuit 77 that controls the current injected into the surface emitting laser device 76 based on the first electric signal input, and the optical receiving unit 75 that includes the photoelectric conversion element 79 that receives the optical signal input from outside, and converts the optical signal into the second electric signal. Further, the optical transceiver 70 includes, at least, the signal multiplexing circuit 72 that multiplexes a plurality of electric signals, the control circuit 77 that controls the surface emitting laser device 76 based on the first electric signal output from the signal multiplexing circuit 72, the photoelectric conversion element 79 that receives the optical signal input from outside, and converts the optical signal into the second electric signal, and the signal separating circuit 73, which functions as a signal demultiplexing circuit that demultiplexes the second electric signal output from the photoelectric conversion element 79 into a plurality of electric signals.

Operations of the optical transceiver 70 according to the fifth embodiment will be explained. The optical transceiver 70 according to the fifth embodiment is configured to transmit and receive plural electric signals. Firstly, a transmission operation of the optical transceiver 70 will be explained.

First, plural electric signals inputted from the outside, or external signal source(s) not shown, are input to the signal multiplexing circuit 72. The signal multiplexing circuit 72 converts the plural electric signals inputted into the first electric signal which is a single electric signal. Then, the signal multiplexing circuit 72 outputs the first electric signal to the drive circuit 77 which functions as the control circuit. The drive circuit 77 controls a current to be injected into the surface emitting laser 76 based on the first electric signal inputted from the signal multiplexing circuit 72. More specifically, the drive circuit 77 controls the surface emitting laser 76 so that the surface emitting laser 76 emits an optical signal having a waveform corresponding to a waveform of the first electric signal. Since surface emitting laser device 100 according to the first embodiment is used as the surface emitting laser element 76, direct optical modulation at 40 Gbps per channel at the maximum is possible. Therefore, the optical transceiver 70 according to the fifth embodiment can transmit a large amount of information added to the optical signal. The optical signal outputted from the surface emitting laser 76 is outputted to the outside, or the external optical device, via the output optical system 78. Here, the optical transceiver 70 finishes the transmission operation.

Next, a reception operation of the optical transceiver 70 will be explained. An optical signal transmitted from the outside, or the external optical device, is incident in the photoelectric conversion element 79 via the input optical system 80, and the photoelectric conversion element 79 receives the optical signal. The photoelectric conversion element 79 has a function of converting the optical signal received to the second electric signal which is an electric signal having a waveform corresponding to a change in intensity of the received optical signal, and a function of outputting the second electric signal. The second electric signal output from the photoelectric conversion element 79 is inputted to the amplifier circuit 81. Since intensity of the optical signal inputted from the outside is generally feeble, intensity of the second electric signal outputted from the photoelectric conversion element 79 is also feeble. The amplifier circuit 81 amplifies intensity of the second electric signal outputted from the photoelectric conversion element 79, and outputs the amplified signal to the signal separation circuit 73. The signal separation circuit 73 separates or demultiplexes the second electric signal inputted via the amplifier circuit 81, namely amplified second electric signal into plural electric signals. Here, the optical transceiver 70 finishes the reception operation.

As described above, according to the optical transceiver 70 according to the fifth embodiment, since the optical transceiver 70 is constituted using the surface emitting laser device 100 according to the first embodiment, advantages such as a low oscillation threshold value, and high-frequency direct modulation of the surface emitting laser 76 can be obtained, and accordingly, it is possible to output an optical signal having a large amount of information with high reliability. Moreover, when an outputted optical signal is transmitted by an optical fiber, and when a 1.3 μm-band single-mode VCSEL (Vertical Cavity Surface Emitting Laser) is used as the surface emitting laser 76, and a single-mode fiber is used as the optical fiber, a transmittable distance is increased to 10 kilometers or more, enabling to perform long distance transmission.

Figure 10:
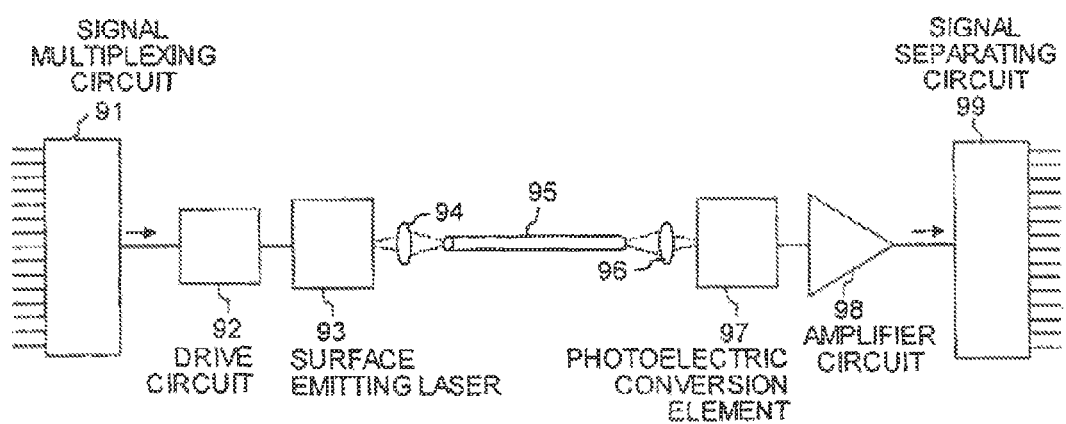
FIG. 10 is a block diagram of an optical communication system according to a sixth embodiment of the present invention.

Next, an optical interconnection or an optical communication system according to a sixth embodiment of the invention will be explained. FIG. 10 is a schematic diagram of a schematic structure of the optical interconnection or the optical communication system according to the sixth embodiment. The optical communication system according to the sixth embodiment uses the surface emitting laser device 100 according to the first embodiment as a signal light source. More specifically, the optical communication system according to the sixth embodiment includes a signal multiplexing circuit 91, a drive circuit 92 connected to the signal multiplexing circuit 91, a surface emitting laser 93 connected to the drive circuit 92, an optical fiber 95 for transmitting optical signals (hereinafter, optical fiber 95), and an optical system 94 for optically combining the surface emitting laser 93 and an end of the optical fiber 95. The surface emitting laser device 100 according to the first embodiment is used as the surface emitting laser 93. Further, the optical communication system includes an photoelectric conversion element 97 optically combined with the other end of the optical fiber 95 via the optical system 96, an amplifier circuit 98 connected to the photoelectric conversion element 97, and a signal separating circuit 99 connected to the amplifier circuit 98.

Namely, the optical communication system according to the sixth embodiment includes, at least, a surface emitting laser device 93, a drive circuit 92 which functions as a control circuit that controls the surface emitting laser device 93, an optical fiber 95 that transmits an optical signal emitted from the surface emitting laser device 93, and a photoelectric conversion element 97 that receives the optical signal from the optical fiber 95, and converts the optical signal into an electric signal.

The signal multiplexing circuit 91 is configured to generate a first electric signal which is a single electric signal obtained by multiplexing plural signals inputted to the signal multiplexing circuit 91 from outside, or external signal source(s) not shown, and configured to output the first electric signal. The first electric signal outputted from the signal multiplexing circuit 91 is inputted to the drive circuit 92. The drive circuit 92 is configured to inject a current into the surface emitting laser 93 and to drives the surface emitting laser 93 based on the first electric signal. Consequently, the surface emitting laser 93 outputs an optical signal having a waveform corresponding to the first electric signal generated by the signal multiplexing circuit 91. The optical signal outputted from the surface emitting laser 93 is incident in an end of the optical fiber 95 via the optical system 94, and propagates through the optical fiber 95.

Then, the optical signal propagating through the optical fiber 95 is emitted from the other end of the optical fiber 95 and is incident in the photoelectric conversion element 97 via the optical system 96. Consequently, the optical signal outputted from the surface emitting laser 93 is transmitted to the photoelectric conversion element 97. The photoelectric conversion element 97 is configured to output an electric signal based on the received optical signal. The amplifier circuit 98 is configured to amplify the electric signal and to output the electric signal amplified to the signal separating circuit 99.

The signal separating circuit 99 is configured to separate or demultiplex inputted electric signal into individual electric signals before being multiplexed by the signal multiplexing circuit 91 and to restore information. In this way, the optical communication system according to the sixth embodiment transmits the information.

As described above, according to the optical communication system according to the sixth embodiment, since the surface emitting laser device 100 according to the first embodiment is used, advantages such as a low oscillation threshold value, high slope efficiency, and high-frequency direct modulation of the surface emitting laser 93 can be obtained, and accordingly, it is possible to surely transmit the optical signal with high reliability, through the optical fiber. More specifically, when a 1.3 μm-band single-mode VCSEL (Vertical Cavity Surface Emitting Laser) is used as the surface emitting laser 93, and a single-mode fiber is used as the optical fiber 95, it is possible to transmit an optical signal directly modulated at 10 Gbit/s even if a fiber length of the optical fiber for transmission 95 is extended to 10 kilometers or more.

As described above, the surface emitting laser device according to the claimed invention is suitable to be applied in the field of an optical interconnection or an optical communication.

Further, the claimed invention is applicable to a VCSEL which outputs a short-wavelength laser beam with wavelength of 700 to 1000 nm (nanometer). When an output of the VCSEL is 850 nm band, an active layer is formed e.g., by an lnGaAs/Al GaAs quantum well where ratio Of ln in composition of the lnGaAs/Al GaAs is nearly 10%. As the DBR (Distributed Bragg Rectifier), for example, $Al_{0.2}Ga_{0.8}As/Al_{0.9}Ga_{0.1}As$ DBR is used, where n type DBR at the substrate side is composed of 35.5 pair, and p type DBR at the opposite side to the substrate is composed of 25 pair. The current confinement layer is formed by selective oxidation.

Further, the VCSEL of the claimed invention can be used as an element of a VCSEL array element having 4 to 12 channels. In this case, for instance, the surface emitting laser device 100 according to the first embodiment can be used as an element of the VCSEL array element, and the surface emitting laser device 100, or the VCSEL, is manufactured in a substantially square shape having dimensions of 250 μm by 250 μm. A VCSEL array element Where VCSELs are arranged linearly with interval of 250 μm to form a 1 by 12 channel VCSEL array element, can be used in the transmitter, the optical transceiver, and in the optical communication system using the transmitter and the optical transceiver. The optical transceiver using the 1 by 12 channel VCSEL array element along with the signal multiplexing circuit and the signal separating circuit has substantially the same configuration as that shown in FIG. 9, except that VCSEL 76 is replaced with the 1 by 12 channel VCSEL array element. In the case of the optical transceiver using the 1 by 12 channel VCSEL array element, the optical transceiver can transmit an optical signal at Gbps (=10 Gps/ch×12 ch), since a VCSEL is operated to transmit the optical signal at 10 Gbps per channel.

The further advantages and modifications may easily be derived by those skilled in the art. Therefore, the present invention in its broader aspect is not limited to the specific detailed and representative embodiments shown and described as above. Accordingly, various modifications may be possible without departing from the spirit and scope of the general concept of the invention defined by the appended claims and the equivalents.

What is claimed is:

1. An optical transmitter comprising:
    a surface emitting laser device that includes
        a substrate;
        an optical resonator arranged on the substrate, the optical resonator including a lower multilayer reflector and an upper multilayer reflector;
        a strained active layer arranged in the resonator, the strained active layer having a multiple quantum well structure formed with a quantum well layer and a barrier layer and
        a current confinement layer arranged on an upper side of the strained active layer, the current confinement layer including a selectively oxidized portion, and being arranged at a position where a strain in the selectively oxidized portion compensates the strained active layer; and
    a control circuit that controls a current injected into the surface emitting laser device based on a first electric signal input.

2. An optical transceiver comprising:
    an optical transmitting unit that includes:
        a surface emitting laser device; and
        a control circuit that controls a current injected into the surface emitting laser device based on a first electric signal input; and
    an optical receiving unit that includes a photoelectric conversion element that receives an optical signal input from outside, and converts the optical signal into a second electric signal, wherein
the surface emitting laser device includes
a substrate;
an optical resonator arranged on the substrate, the optical resonator including a lower multilayer reflector and an upper multilayer reflector;
a strained active layer arranged in the resonator, the strained active layer having a multiple quantum well structure formed with a quantum well layer and a barrier layer; and
a current confinement layer arranged on an upper side of the strained active layer, the current confinement layer including a selectively oxidized portion, and being arranged at a position where a strain in the selectively oxidized portion compensates the strained active layer.

3. An optical transmitter/receiver comprising:
a surface emitting laser device;
a signal multiplexing circuit that multiplexes a plurality of electric signals;
a control circuit that controls the surface emitting laser device based on a first electric signal output from the signal multiplexing circuit;
a photoelectric conversion element that receives an optical signal input from outside, and converts the optical signal into a second electric signal; and
a signal demultiplexing circuit that demultiplexes the second electric signal output from the photoelectric conversion element into a plurality of electric signals, wherein
the surface emitting laser device includes
a substrate;
an optical resonator arranged on the substrate, the optical resonator including a lower multilayer reflector and an upper multilayer reflector;
a strained active layer arranged in the resonator, the strained active layer having a multiple quantum well structure formed with a quantum well layer and a barrier layer, and
a current confinement layer arranged on an upper side of the strained active layer, the current confinement layer including a selectively oxidized portion, and being arranged at a position where a strain in the selectively oxidized portion compensates the strained active layer.

4. An optical communication system comprising:
a surface emitting laser device;
a control circuit that controls the surface emitting laser;
an optical fiber that transmits an optical signal emitted from the surface emitting laser device; and
a photoelectric conversion element that receives the optical signal from the optical fiber, and converts the optical signal into an electric signal, wherein
the surface emitting laser device includes
a substrate;
an optical resonator arranged on the substrate, the optical resonator including a lower multilayer reflector and an upper multilayer reflector;
a strained active layer arranged in the resonator, the strained active layer having a multiple quantum well structure formed with a quantum well layer and a barrier layer; and
a current confinement layer arranged on an upper side of the strained active layer, the current confinement layer including a selectively oxidized portion, and being arranged at a position where a strain, in the selectively oxidized portion compensates the strained active layer.

5. An optical transmitter comprising:
a surface emitting laser array device having an array of surface emitting laser devices and having 4 to 12 channels, wherein
each of the surface emitting laser devices includes:
a substrate;
an optical resonator arranged on the substrate, the optical resonator including a lower multilayer reflector and an upper multilayer reflector,
a strained active layer arranged in the resonator, the strained active layer having a multiple quantum well structure formed with a quantum well layer and a barrier layer; and
a current confinement layer arranged on an upper side of the strained active layer, the current confinement layer including a selectively oxidized portion, and being arranged at a position where a strain in the selectively oxidized portion compensates the strained active layer, and
a control circuit that controls a current injected into the surface emitting laser array device based on a first electric signal input.

6. An optical transceiver comprising:
an optical transmitting unit that includes:
a surface emitting laser array device having an array of surface emitting laser devices and having 4 to 12 channels; and
a control circuit that controls a current injected into the surface emitting laser array device based on a first electric signal input; and
an optical receiving unit that includes a photoelectric conversion element that receives an optical signal input from outside, and converts the optical signal into a second electric signal, wherein
each of the surface emitting laser devices includes
a substrate;
an optical resonator arranged on the substrate, the optical resonator including a lower multilayer reflector and an upper multi layer reflector;
a strained active layer arranged in the resonator, the strained active layer having a multiple quantum well structure formed with a quantum well layer and a barrier layer; and
a current confinement layer arranged on an upper side of the strained active layer, the current confinement layer including a selectively oxidized portion, and being arranged at a position where a strain in the selectively oxidized portion compensates the strained active layer.

7. An optical transmitter/receiver comprising:
a surface emitting laser array device having an array of surface emitting laser devices and having 4 to 12 channels;
a signal multiplexing circuit that multiplexes a plurality of electric signals;
a control circuit that controls the surface emitting laser array device based on a first electric signal output from the signal multiplexing circuit;
a photoelectric conversion element that receives an optical signal input from outside, and converts the optical signal into a second electric signal; and
a signal demultiplexing circuit that demultiplexes the second electric signal output from the photoelectric conversion element into a plurality of electric signals, wherein each of the surface emitting laser devices includes
a substrate;
an optical resonator arranged on the substrate, the optical resonator including a lower multilayer reflector and an upper multilayer reflector;
a strained active layer arranged in the resonator, the strained active layer having a multiple quantum well structure formed with a quantum well layer and a barrier layer; and
a current confinement layer arranged on an upper side of the strained active layer, the current confinement layer including a selectively oxidized portion, and being arranged at a position where a strain in the selectively oxidized portion compensates the strained active layer.

8. An optical communication system comprising:
a surface emitting laser array device having an array of surface emitting laser devices and having 4 to 12 channels;
a control circuit that controls the surface emitting laser array device;
an optical fiber that transmits an optical signal emitted from the surface emitting laser array device; and
a photoelectric conversion element that receives the optical signal from the optical fiber, and converts the optical signal into an electric signal, wherein
each of the surface emitting laser devices includes
a substrate;
an optical resonator arranged on the substrate, the optical resonator including a lower multilayer reflector and an upper multilayer reflector;
a strained active layer arranged in the resonator, the strained active layer having a multiple quantum well structure formed with a quantum well layer and a barrier layer; and
a current confinement layer arranged on an upper side of the strained active layer, the current confinement layer including a selectively oxidized portion, and being arranged at a position where a strain in the selectively oxidized portion compensates the strained active layer.

* * * * *